United States Patent [19]

Dumoulin et al.

[11] Patent Number: 4,714,081
[45] Date of Patent: Dec. 22, 1987

[54] METHODS FOR NMR ANGIOGRAPHY

[75] Inventors: Charles L. Dumoulin, Ballston Lake; Howard R. Hart, Jr., Schenectady, both of N.Y.

[73] Assignee: General Electric Company, Schenectady, N.Y.

[21] Appl. No.: 835,683

[22] Filed: Mar. 3, 1986

[51] Int. Cl.[4] .............................................. A61B 5/05
[52] U.S. Cl. ..................................... 128/653; 324/306; 324/309
[58] Field of Search ................. 128/653; 324/306, 309, 324/312, 307

[56] References Cited

U.S. PATENT DOCUMENTS

| | | | |
|---|---|---|---|
| 4,521,733 | 6/1985 | Bottomley et al. | 324/309 |
| 4,528,985 | 7/1985 | Macouski | 324/309 |
| 4,532,473 | 7/1985 | Wehrli | 128/653 |
| 4,587,489 | 5/1986 | Wenrli | 324/307 |
| 4,595,879 | 6/1986 | Lent et al. | 324/306 |
| 4,602,641 | 7/1986 | Feinberg | 324/306 X |
| 4,609,872 | 9/1986 | O'Donnell | 324/306 |

Primary Examiner—William E. Kamm
Assistant Examiner—Ruth S. Smith
Attorney, Agent, or Firm—Geoffrey H. Krauss; James C. Davis, Jr.; Marvin Snyder

[57] ABSTRACT

Magnetic field gradient and radio-frequency (RF) pulse signal sequences permitting moving nuclear spins to be selectively detected and then displayed as projected angiographic data in a nuclear magnetic resonance (NMR) image, without the use of contrast agents. The method allows the intensity of an image pixel to be determined by the macroscopic detected spin velocity and can provide essentially complete suppression of non-moving spins. Resulting images have high signal-intensity dynamic range for detected vessels. The selected detection of moving flows is not dependent upon pulsatile flow so that venous and arterial structures are equally as well visualized in high-resolution NMR angiographic images.

22 Claims, 5 Drawing Figures

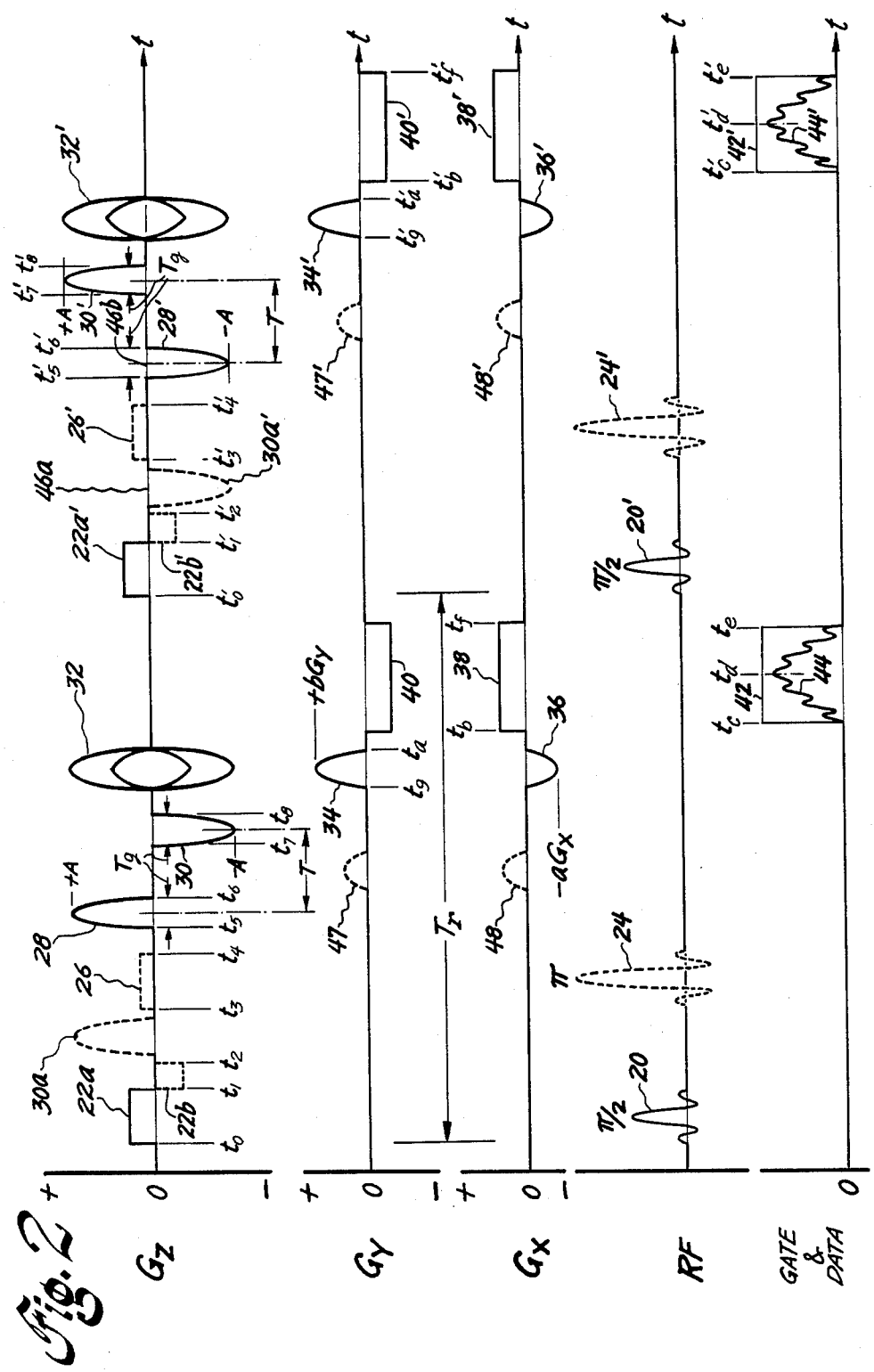

METHODS FOR NMR ANGIOGRAPHY

BACKGROUND OF THE INVENTION

The present invention relates to methods for imaging fluid flow in a sample and, more particularly, to novel methods using magnetic field gradient and radio-frequency pulse signal sequences which permit nuclear magnetic resonance (NMR) angiographic images to be noninvasively obtained of any medically significant anatomy portion in which fluid flow occurs.

It is well known to provide images of angiographic data, indicating the flow of bodily fluids through various bodily passages, for medical diagnostic purposes. Typically, angiographic procedures have utilized ionizing radiation and have frequently required the use of contrast agents. It is well known that the use of contrast media occasions patient discomfort and is not without a certain probability of physical risk. It is not only desirable to provide angiographic images utilizing nuclear magnetic resonance processes to eliminate the use of ionizing radiation, but it is also desirable to provide NMR angiographic images which visualize all of the major fluid-carrying vessels of the anatomical portion being imaged, with a high degree of suppression of non-moving nuclear spins and without the use of any contrast agent.

BRIEF SUMMARY OF THE INVENTION

In accordance with the invention, a method for providing a nuclear magnetic resonance image substantially only of moving spins associated with fluid flow in a sample, includes the steps of: operating upon the spins, of all nuclei in at least a desired volume of said sample, with a plurality of pairs of respective first and second sequential excitation sequences to acquire the same plurality of pairs of respective first and second sets of NMR response signals from said sampled volume; commencing each of the first and second excitation sequences by nutating the spins of all nuclei in at least the desired volume in a first direction relative to a preselected axis of projection; then causing all nuclear spins to evolve while flow-encoding the phase of the evolving spins in a first manner in the first excitation sequence and in a second manner, different from the first manner, in the second sequence; then receiving NMR response signals from at least the sample volume to provide first and second sets of response signals, each having differing information responsive to the nuclei in an associated volume element being in one of stationary or moving conditions; then subtracting the response signals received responsive to the first excitation sequence from the response signals received responsive to the second excitation sequence to provide a set of difference data; and transforming the set of difference data into an image of only moving spins in the sample volume, as viewed from a projection direction substantially orthogonal to a plane defined by the direction of magnetic field gradients utilized in the excitation sequences.

In presently preferred embodiments of our NMR angiographic methods, the flow-encoding step is performed with first and second flow-encoding pulses of substantially the same amplitude and pulse shape, but of opposite polarity, in the magnetic field gradient along one dimension of the projection plane of the resulting NMR angiograph, with the polarity of each pulse of the alternating-polarity pulse pair being reversed in the second excitation sequence, to cause the response signals from stationary nuclear spins to provide signals of alternating polarity in the first and second sets of response signals. In another embodiment, the flow-encoding pulses in the first excitation sequence can be unipolar, with the second sequence being devoid of both flow-encoding gradient pulse signals. In either embodiment, by varying the readout magnetic field gradients along two axes of a Cartesian coordinate set of axes defined by the physical construction of the gradient coils, the direction of angiographic projection can be rotated in any desired manner.

Accordingly, it is an object of the present invention to provide novel methods for the nuclear magnetic resonance angiographic imaging of moving fluid flowing in vessels through a desired portion of a sample, such as the anatomy of a living subject.

This and other objects of the present invention will become apparent upon reading of the following detailed description of our invention, when considered in conjunction with the drawings.

BRIEF DESCRIPTION OF THE DRAWINGS

FIG. 2 is a set of time-coordinated graphs illustrating the magnetic field gradient, radio-frequency, data gate and received data signals utilized during one complete repetition of one presently preferred method for NMR angiography;

DETAILED DESCRIPTION OF THE INVENTION

Figure 1:
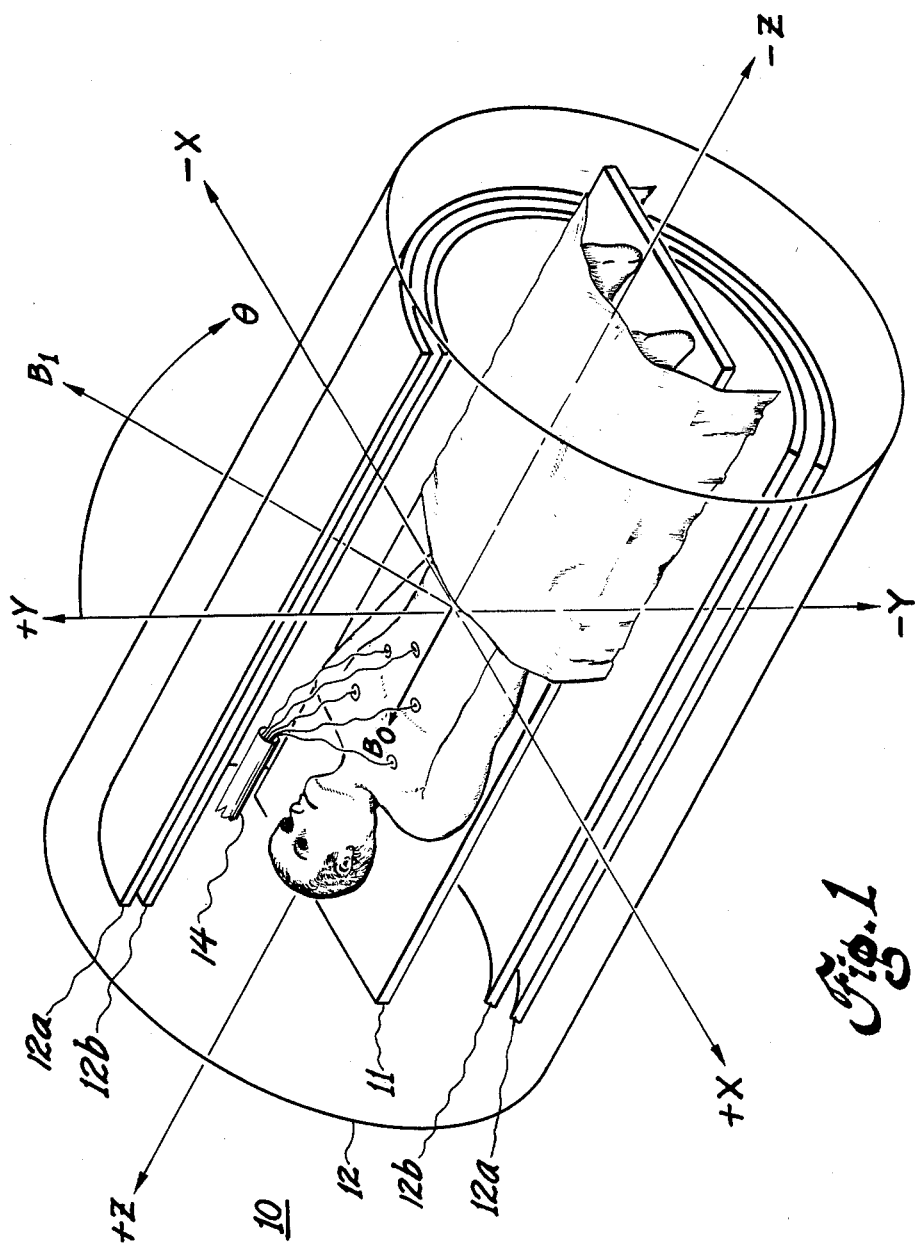
FIG. 1 is a perspective view of the bore of a magnet for producing a static field in a NMR imaging apparatus, illustrating sample positioning amidst the various magnetic field gradient and RF field-producing means, and useful for defining various conventions utilized therewith.

Referring initially to FIG. 1, the method of the present invention is practiced in a nuclear magnetic resonance (NMR) system 10 in which a sample, e.g., a patient, is placed upon carrier means 11 and moved into an imaging region. This region, illustrated as being within the bore 12 of a magnet means (not shown), is one in which a highly homogeneous and relatively high-intensity static magnetic field $B_0$ is provided. The illustrated static magnetic field-forming means bore 12 is cylindrical and the static magnetic field $B_0$ is formed along a chosen volume axis, e.g., the Z axis of a Cartesian coordinate system having its center within the magnet means bore. Magnetic field gradient-forming means 12a, associated with the main static magnetic field-forming means bore 12, is used to form a set of substantially orthogonal magnetic field gradients impressed upon the static field. For the illustrated Cartesian coordinate system, the three gradients $G_X$, $G_Y$ and $G_Z$ can be summarized as: $G_Z = \partial B_0/\partial z$, $G_Y = \partial B_0/\partial y$, and $G_X = \partial B_0/\partial x$. In addition to the static magnetic field $B_0$ and the magnetic field gradients $G_X$, $G_Y$ and $G_Z$ therein provided by the gradient coil means 12a (typically positioned within the magnet means bore 12), at least one coil means 12b (also typically positioned within bore 12 and further situated within the bore of gradient coils 12a), is energized, by means not shown, to provide a radio-frequency (RF) magnetic field $B_1$ rotating at the resonance, or Larmor, frequency $\omega = \gamma B_0$, where $\gamma$ is the gyromagnetic constant for the particular nuclear species to be imaged. The static magnetic field $B_0$, the magnetic field gradients $G_X$, $G_Y$ and $G_Z$ and the RF magnetic field $B_1$ are all provided by means, and in manner, well known to the art. In addition to the remainder of the NMR imaging system (not shown), monitor lead means 14, for providing cardiac (EKG) signals to the NMR imaging system, may be provided to the chest area of a patient to be imaged. Cardiac gating of the NMR angiography sequences may be utilized to prevent periodic motion artifacts, i.e., ghosts, from appearing in the final image and/or for selecting a particular portion of interest of the cardiac cycle during which the NMR angiograph is taken.

Referring now to FIG. 2, the basic method for our novel NMR angiographic process utilizes a sequential application of magnetic field gradient and RF magnetic field pulse signals for providing NMR response signals containing information as to the concentration and motion of the spins of a selected nuclear species. In the first of each pair of sequences, the magnetic field gradient and RF magnetic field pulse signals so excite all of the selected species spins that the imaging response data is acquired from both moving and stationary nuclear spins. The second sequence of each sequence pair also acquires response data from stationary and moving spins, for subsequent subtraction from the data (stored responsive to the first sequence step) containing information as to both the static and moving nuclear spins within the imaging volume. The first sequence step starting time $t_0$ and the second sequence step $t_0'$ (of each of the alternating sequences of a sequence pair) may be determined by cardiac gating to set the sequence repetition time interval $T_r$. The pair of alternating sequences are substantially identical with the exception of a pair of flow-encoding pulses applied along a selected one of the axes of the desired projection, and further discussed hereinbelow. A series of alternating sequence pairs are utilized with different values of a phase-encoding magnetic field gradient in the direction along the selected axis of projection, while response data is read out along a substantially orthogonal direction, to obtain a two-dimensional projection of fluid flow activity within the sample being imaged.

The first imaging sequence, of each alternating sequence pair, commences at time $t_0$ (which may be established by a triggering event) during the nutation portion of the sequence. A 90°, or $\pi/2$, RF pulse signal 20 is applied to nutate all spins, both stationary and non-stationary, within the excitation region of the RF excitation coil 12b. RF pulse signal 20 may be a non-selective signal, typically having a rectangular envelope and applied in the absence of all magnetic field gradients, or may be a slice-selective signal, as illustrated, to limit the field-of-view or the depth of the projection, if desired. While a slice-selective pulse signal is not necessary, the slice-selective signal pulse 20 may, if used, be of a truncated-sinc form, applied in the presence of a gradient magnetic field signal pulse 22a applied along the selected axis of projection, e.g., in the $G_Z$ gradient field along the Z axis. Both the $\pi/2$ RF pulse 20 and the associated magnetic field gradient $G_Z$ pulse 22a terminate at time $t_1$. Optionally, a rephasing pulse 22b, along the same axis of projection (e.g., the Z-axis) may then be applied in the time interval between time $t_1$ and $t_2$, with an amplitude such that $$\frac{1}{2}\int_{t_0}^{t_1} G_Z(t)dt = \int_{t_1}^{t_2} G_Z(t)dt.$$

The nutation of spins during the second, alternating sequence utilizes an identical $\pi/2$ RF signal pulse 20'; the phase of the RF signal carrier is held substantially constant for all nutating $\pi/2$ RF signal pulses in all sequences of the entire imaging procedure. If a slice-selective nutating signal is utilized, then each second sequence, of each sequence pair, uses a selective gradient portion 22a' which is substantially the same as the gradient portion 22a of the first sequence of the sequence pair; if the optional rephasing gradient portion 22b is used in the first sequence, then a substantially similar rephasing portion 22b' is used in the second sequence.

An evolution time interval, from time $t_2$ through time $t_5$ in the first sequence (or from time $t_2'$ through time $t_5'$ in the second sequence) allows the phase of the nutated spins to change as a function of resonance offset and the local magnetic field. The dephasing spins, both moving and non-moving, may (but need not) be refocused, if desired, by a 180°, or $\pi$, RF signal pulse 24 in the first sequence or a substantially identical RF signal pulse 24' in the second sequence, which may be applied, if used, in the time interval between time $t_2/t_2'$ after the end of the nutation-rephasing pulses 22b/22b', and time $t_5/t_5'$, when the flow-encoding gradient pulses commence. Thus, the spin of each nucleus in the sample has a phase which, immediately prior to time $t_5/t_5'$, is substantially identical for both sequences.

In accordance with the invention, a pair of flow-encoding pulses are applied in a selected gradient direction, after application of the $\pi/2$ RF signal pulse, and after the $\pi$ RF signal pulse 24 if used. While the plane of angiographic projection is essentially independent of the direction of the gradient magnetic field having the flow-encoding signal pulses, it is convenient to apply the flow-encoding pulses along one of the main axes (e.g., the Z-axis) of the chosen coordinate system. The pair of flow-encoding gradient field pulse signals 28 and 30 are of opposite polarity during each sequence, with the polarities being reversed in the second sequence of a seqeunce pair. Thus, the first gradient pulse 28 is: applied for a predetermined gradient time interval $T_g$, between time $t_5$ and time $t_6$; is of a known amplitude A; and is of a first polarity, e.g., of positive polarity. The second pulse 30 of the same sequence is: of substantially identical time duration, e.g., also occurring in a time interval $T_g$, from commencement time $t_7$ through termination time $t_8$; is of substantially the same amplitude A; but is of the opposite polarity, e.g., negative polarity, from pulse 28. In the second sequence of the sequence pair, the first gradient pulse 28' is of the opposite polarity, e.g., negative polarity, from the (positive) polarity of the first pulse 28 in the first sequence and the second pulse 30' of the second sequence is of opposite polarity, e.g., positive polarity, from the (negative) polarity of the second pulse 30 in the first sequence. The second sequence pulses 28' and 30' are each of substantially the same amplitude A as the amplitude of the first sequence pulses, and each occur with the same duration $T_g$. This flow-encoding pulse duration $T_g$ is determined by factors discussed hereinbelow. The time interval T between the mid-point of each of the first and second pulses of any sequence, i.e., between pulse 28 and pulse 30 of the first sequence or between pulse 28' and pulse 30' of the second sequence, is substantially identical for all sequences. This time interval T is usually, but not always, selected to be much longer than time interval $T_g$.

As mentioned hereinabove, the axis of application of flow-encoding gradient signals is completely arbitrary, and is independent of subsequent image formation sub-sequences utilized. Thus, after the cessation of the second flow-encoding gradient pulse 30, or pulse 30', stationary spins have been subjected to a pair of substantially identical, opposite polarity pulses and the spins thereof have been substantially unaffected, as the time integral of the pair of flow-encoding gradient fields is substantially zero. The moving spins, after nutation, are given a phase change which is a function of the velocity of that moving spin along the projection axis of the gradient. This phase change can be measured by either using the pulse sequence without the flow-encoding gradient pulses either before or after the sequence with the flow-encoding gradient pulses, or by repeating the pulse sequence with inverted flow-encoding gradient pulses. Two sets of data are acquired with either the non-inverted/inverted pulses or the present/absent, or absence/present, pulses pair of sequences, and the difference is taken between the data sets, to cause cancellation of signals from non-moving spins; the moving spins, having different phases in the two data sets (due to position changes in the time between acquisition of each set of data) will be detected as non-zero-magnitude difference signals. This detection occurs after the image formation sub-sequence portions of each sequence pair.

In the illustrated sequence pair, the image formation sub-sequences are gradient-refocused spin-warp sub-sequences. It should be understood that other imaging sub-sequences can be equally as well utilized. In each of the pair of spin-warp gradient-refocused sub-sequences illustrated (respectively commencing at time $t_9$ or time $t_9'$,) that magnetic field gradient along one axis of the projection, here taken to be a projection having one axis solely along one coordinate axis (the Z-axis), is utilized for each of the dephasing gradient signal portions 32 or 32'; a different one of the varying values of magnetic field gradient along this Z-axis will be applied during each subsequent sequence pair, to derive the entire data set necessary for the angiographic projection. In the same dephasing time interval, from time $t_9$ to time $t_a$ (or from time $t_9'$ to time $t_a'$), dephasing magnetic field gradient portions 34 and/or 36 (or portions 34' and/or portions 36') are provided in at least one of the other two mutually orthogonal axes, to define the second axis of the projection. Thus, it will be seen that oblique projections can be taken at any angle to the remaining axes, e.g., any angle with respect to the remaining X and Y axes when a first projection axis has been selected along the Z axis, relative to the sample by scaling the relative amount of magnetic field gradient along each of the two orthogonal axes. This scaling varies as the sine and cosine of the angle $\Theta$ at which the oblique projection is taken with respect to a reference angle, e.g., a 0° angle being defined as having an axis of projection in the +Y direction. Here, scaled dephasing gradient lobes 34 and 36 are utilized with amplitudes established by $A_x = A_{max} \sin \Theta$ and $A_y = A_{max} \cos \Theta$. The subsequent readout gradients, e.g., a $G_X$ readout gradient portion 38 and a $G_Y$ readout gradient portion 40, have similar scalings. Essentially the same dephasing and readout gradient portions 34', 36', 38' and 40' will be utilized in the second sequence of each pair as the portions 34, 36, 38 and 40 used in the first sequence of that pair. The response data is received during the readout gradient-application time interval, from commencement time $t_b$ to time $t_f$ (or time $t_b'$ to time time $t_f'$), and the reception gate 42 or 42' is enabled from time $t_c$ to time $t_e$ (or time $t_c'$ to time $t_e'$) so that an NMR response data signal 44 (or 44') is detected, digitized and stored. The difference of the data sets digitized from the acquired NMR response signals 44/44' is taken to provide the data for an image. A pair of images, each sensitive to flow in one of the two orthogonal directions each perpendicular to the axis of projection (which is that direction perpendicular to the plane of the projection), are then combined to produce the final angiographic image.

We therefore selectively detect only the spins of nuclei having macroscopic motion, by first applying to that set of spins a magnetic field gradient which, for a given amount of time, will change the phase of the nutating spins as a function of position along the axis of the applied gradient, and then applying, at a later time, a substantially identical magnetic field gradient, having a reversed polarity, to cause any spin which does not change position along the gradient axis to experience substantially no net phase change. Any spin which has moved in the direction of the gradient axis will, however, experience a net phase change which can be measured by subsequently repeating the pulse sequence as a second sequence devoid of either the flow-encoding gradient pulse pair or with an inverted pair of flow-encoding gradient pulses.

We have, for example, in a different mode utilized a pair of identical-polarity flow-encoding gradient pulses, e.g., pulse 30a and subsequent pulse 28, in a first sequence, followed by a second sequence, of the sequence pair, in which a second pair of identical-polarity pulses 30a' and 28' were used, or optionally replaced by essentially-zero amplitude magnetic field gradient portions 46a and 46b. In this experiment, the unipolarity pulses 30a and 28 (and pulses 30a' and 28', if used) are spaced by substantially equal time intervals to either side of the associated $\pi$ RF pulse signal 24 (or the associated pulse signal 24'). We have found that this dual-sequence scheme, with a pair of sequences in which a first sequence has a pair of flow-encoding gradient pulses, symmetrically disposed about the $\pi$ pulse, and a second sequence is with or without flow-encoding gradient pulses, provides inferior angiographic images, with respect to images provided by the illustrated inverted flow-encoding gradient pulse pairs, mirror-imaged in each of a pair of sequences.

In the illustrated sequence, a relationship can be derived between detected signal strength and the flow velocity of the moving spins. If a group of spins moves from a first position, denoted $X_1$, to another position, denoted $X_2$, in the time interval T, the first pulse (of a pair of opposite-polarity equal-duration gradient pulses) changes the phase of the transverse spin magnetization, at position $X_1$, by an amount $$\Phi_1 = \gamma \int_O^{T_g} X_1 G_x(t) dt,$$

where $G_x(t)$ is the strength of the magnetic field gradient in the chosen (e.g., X-axis) direction of movement, as a function of time, and $T_g$ is the duration of the gradient pulse (e.g., $T_g = t_6 - t_5$ or $t_8 - t_7$, etc.). The second, opposite-polarity, gradient pulse provides a second phase change $$\Phi_2 = -\gamma \int_0^{T_g} X_2 G_x(t) dt,$$

where $X_2$ is the position of the spins at the time of commencement of the second pulse. The net change in phase generated by the pair of opposite-polarity pulses is $$\Phi = \Phi_1 = \Phi_2 = (X_1 - X_2)\gamma \int_0^{T_g} G_x(t) dt.$$

Therefore, the changing position can be written as the product of a velocity V and time T, such that $$\Phi = VT\gamma \int_0^{T_g} G_x(t) dt.$$

Upon subtraction of the two acquired data sets, the signal intensity I obtained with the inverted flow-encoding gradients 28/28' and 30/30' is $$I = k(\sin \Phi) + k(\sin \Phi) = 2k(\sin \Phi),$$

where k is a proportionality factor which includes instrument sensitivity and spin populations. Because the flow sequences are capable of detecting only the component of flow along the axis (here the Z-axis) of the applied gradient (here $G_Z$) flow-encoding pulses, the intensity of detected vessels is dependent upon the direction of flow as well as the velocity. Sensitivity to flow direction can be removed by acquiring two, or possibly three, images, each sensitive to flow in a direction orthogonal to the direction of flow sensitivity of the other image, or pair of images. The data for each of the two (or three) images can be combined in a pixel-by-pixel fashion using the relationship $$I_{total} = (I_x^2 + I_y^2 + I_z^2)^{\frac{1}{2}}.$$

The images must be combined after Fourier transformation and magnitude calculation, as the phase information from the individual images cannot be unambiguously combined. It may be noted that the detected spin intensity $I_{total}$ is actually a periodic function of the macroscopic spin velocity. Therefore, for a given amplitude A of the flow-encoding gradient pulses and a given interpulse delay time interval T, it is possible to have a non-zero spin velocity which results in a substantially zero image intensity I. It will also be seen that velocities which result in a total phase shift of $(n\pi \pm \Phi)$, where n is a positive or negative integer, will give signal intensities which are identical to the signal intensity of a spin having a different velocity, which velocity results in a phase shift $\Phi$. Therefore, aliasing of velocities can occur if the plurality of velocities result in phase shifts which have difference in integer multiple of $\pi$ radian. Careful choice of flow-encoding gradient amplitude A and pulse time interval T must be made to obtain proper images. However, the ambiguity in velocity measurement can be removed by acquiring a series of images, with each image taken at a different amplitude A of the flow-encoding gradient pulses, prior to Fourier-transforming the entire data set in the dimension along which the gradient is varied, to give the velocity dimension of the projected image. Here we recognize that angiographic images, being projections, have the intensity of each pixel therein representing the sum of the contributions of a column of spins having a distribution of velocities, so that the Fourier transformation of the data obtained with different gradient amplitudes A yields the distribution of the velocities in that column.

By having all of the sequence-to-sequence varying portions limited to only the pair of flow-encoding gradient pulses 28/30, eddy current problems will be minimized as (1) all changing gradient activity, in each sequence, occurs after the last RF signal pulse, and (2) even these gradient pulses have a net zero integral. Similarly, artifacts, due to non-constant blood flow during the cardiac cycle, are minimized by synchronizing the sequences to the patient's heart beat. Suppression of non-moving spins may also be enhanced by applying a pair of magnetic field gradient portions 47 and 48, or 47' and 48', along that axis orthogonal to the display plane to dephase the large signal arising from the stationary spins; since detected signals arise from phase differences from relatively small regions, the signal intensity from blood vessels is only slightly attenuated thereby.

Figure 3A:
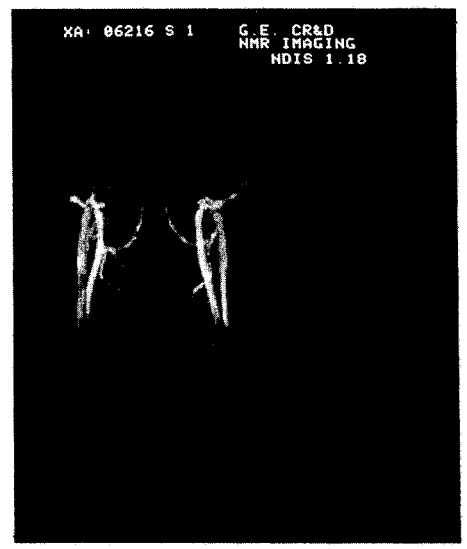
FIGS. 3a and 3b are photographs of NMR imaging apparatus displays of NMR angiographic data of the neck region of a healthy human adult volunteer, responsive to use of the methods of the present invention.
Figure 3:
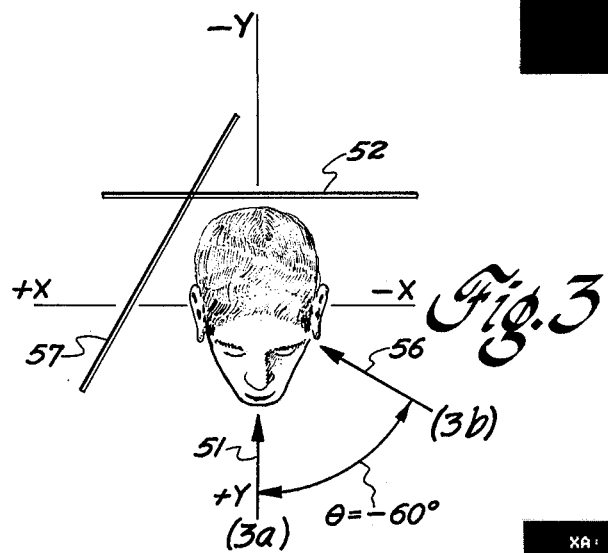
FIG. 3 is a schematic view of a portion of human anatomy and of a plurality of projective directions and associated projection planes established with respect thereto.
Figure 3B:
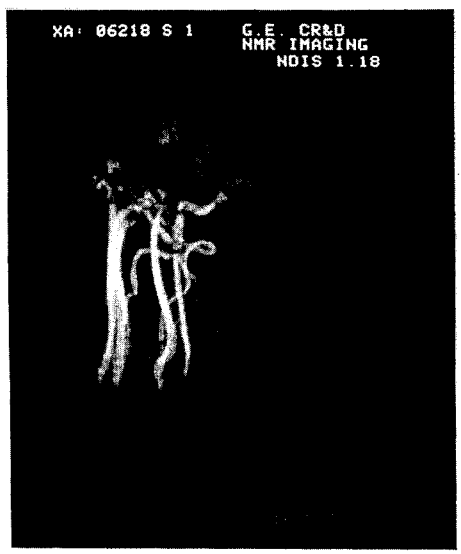

Referring now to FIGS. 3, 3a and 3b, angiographs of human anatomy obtained by the methods of the present invention contain projective images of both arterial and venous structures, obtained without the use of contrast media. In the photos of two angiographic NMR images (in FIGS. 3a and 3b) the planes of projection and the directions of projection are as illustrated in FIG. 3. The images, of the neck region of a healthy adult male volunteer, were taken in a 1.5T static field system, of the type described in Ser. Nos. 743,114 and 743,125, both filed June 10, 1985, now respective U.S. Pat. Nos. 4,667,159 (issued May 19, 1987) and 4,689,563 (issued Aug. 25, 1987), assigned to the assignee of the present application and incorporated herein in their entireties by reference. An anterior-posterior projection of the neck region was taken with an angle of approximately 0° with respect to the Y axis 51, so that the plane 52 of the associated projection lies in the X-Z plane. The flowing blood in the subject's jugular veins, carotid arteries and vertebral arteries is clearly seen on both the left and right sides of the subject. It will be seen that intervening stationary portions of the corpus are substantially absent from the image and that the detection of moving blood flow is not dependent upon pulsatile flow, so that venous and arterial structures are equally as well visualized. It should be noted that the image of FIG. 3a was obtained with the Y-axis phase-encoding gradient pulse 34 and readout gradient pulse 40 having essentially zero values, to establish the second projection plane axis solely in the X direction. By shifting the view to a new direction of projection 56, at approximately a 60° oblique angle from the anterior-posterior projection of FIG. 3a, the plane of projection 57 (being perpendicular to the projection line 56) still has one axis lying in the Z direction, but has the other projection plane axis falling along a line cutting the X-Y plane. This corresponds to the illustrated $G_X = -aG_{x,max}$, where $-a$ is sin $(-60°)$, and $G_Y = +bG_{y,max}$, where $b =$ cosine $(-60°)$. In this oblique lateral projection, the arteries and veins of subject's neck region are imaged with the same high resolution, but without the need for moving the subject.

While the novel methods for NMR angiography of our present invention have been described with reference to presently preferred embodiments thereof, many modifications and variations will now become apparent to those skilled in the art. It is therefore our intention to be limited only by the scope of the appending claims and not by the specific details and instrumentalities presented herein by way of description of presently preferred embodiments.

What is claimed is:

1. A method for providing a nuclear magnetic resonance (NMR) angiographic projection image of flowing fluids in at least a selected portion of a sample, comprising the steps of:

(a) immersing the sample in a main static magnetic field;

(b) nutating, in the initial portion of each of a first sequence and a second sequence of a sequential pair of imaging sequences, the spins of all nuclei of a selected species;

(c) providing an evolution time interval after step (b) in each of the pair of sequences;

(d) applying, in the evolution time interval of at least one of the first and second sequences of each sequence pair, a pair of flow-encoding gradient field pulses in a first magnetic field gradient impressed upon the sample, in a first direction selected to establish one axis of the NMR angiographic projection image, to cause a resulting NMR response signal from the spin of moving nucleus to differ from the NMR response signal resulting from the spin of a substantially stationary nucleus;

(e) then applying a magnetic field gradient pulse in a second direction, orthogonal to the first direction, to dephase, and enhance suppression of, response signals from spins from all stationary nuclei of the selected species;

(f) then acquiring, responsive to at least a second magnetic field gradient impressed upon the sample in the second direction, a set of data from the NMR response signals evoked from at least the sample portion in each of a response data acquisition portion of the first and second sequences;

(g) substracting the data of one of the NMR response signal data sets acquired in the first and second sequences from the data of the other data set to substantially remove response data obtained from the substantially stationary nuclei; and (h) generating, responsive to the remaining response data, the NMR angiographic projection image as a two-dimensional projection, lying in a plane in the first and second directions, of the fluid flow in the three-dimensional sample.

2. The method of claim 1, wherein step (d) includes the steps of: applying a flow-encoding pair of first magnetic field gradient pulses in each of the first and second sequences; causing each pulse of the pair to have a polarity different from the polarity of the other pulse; and causing the polarity of the first pulse of each pair to alternate in each different one of the pair of sequences.

3. The method of claim 2, wherein step (d) further includes the step of providing the four flow-encoding gradient pulse signals of each sequence pair with a substantially constant amplitude.

4. The method of claim 3, further comprising the steps of: repeating the sequence of steps (b)-(f) in a predetermined plurality of total repetitions; providing in each repetition a different value of a phase-encoding signal in the magnetic field gradient in the first direction; and generating the image of step (g) from the totality of difference data sets obtained from all of the sequence pairs.

5. The method of claim 4, further comprising the steps of: processing the remaining response data of step (g) to obtain a first set of intensity $I_1$ date for each pixel in the chosen angiographic projection plane; repeating the total plurality of repetitions of the sequence of steps (b)-(g) with the first magnetic field gradient repositioned, in each repetition, along at least one other one of a second and third axis in a Cartesian coordinate system; processing the remaining response data of the step (g) of each repetition of the sequence of steps (b)-(g), to obtain a different designated set of intensity $I_2$ and $I_3$ data, respectively, for each pixel in the angiographic projection plane chosen for the repetition along the respective second and third axis; and processing, for each image pixel, the intensity data obtained for that image pixel for each of the different first gradient portions, to provide the RMS average intensity $I_{total} = (I_1^2 + I_2^2 + I_3^2)^{\frac{1}{2}}$, of the totality of difference data sets for image generation.

6. The method of claim 3, further comprising the step of adjusting the time duration $T_g$ of each gradient pulse to accept for imaging, without aliasing, the range of fluid flow velocities in the sample.

7. The method of claim 2, wherein step (b) comprises the step of applying a radio-frequency (RF) magnetic field to the sample with sufficient energy to nutate the net magnetization of the nuclear spins through an angle substantially equal to 90 degrees.

8. The method of claim 7, wherein the nutation of spins is to occur substantially only in the selected sample portion, and further comprising the step of applying the magnetic field gradient, in the first direction, to the sample during application of the RF magnetic field.

9. The method of claim 8, wherein the RF magnetic field is applied as a pulsed signal having a $\sin(x)/x$ envelope shape.

10. The method of claim 7, wherein step (c) further comprises the step of refocusing the spins of the nutated nuclei prior to applying the flow-encoding gradient magnetic field pulses.

11. The method of claim 10, wherein the refocusing step includes the steps of: applying the magnetic field gradient in the first direction, and applying the RF magnetic field to the sample with sufficient energy to nutate the net magnetization of the nuclear spins through an angle substantially equal to 180 degrees.

12. The method of claim 1, wherein step (d) includes the steps of: applying a flow-encoding pair of first magnetic field gradient pulses in only the first sequence; and causing each pulse of the pair to have the same polarity.

13. The method of claim 12, wherein step (d) further includes the step of providing each of the pair of flow-encoding gradient pulse signals of each first sequence with a substantially constant amplitude.

14. The method of claim 13, further comprising the steps of: repeating the sequence of step (b)-(f) in a predetermined plurality of total repetitions; providing in each repetition a different value of a phase-encoding signal in the magnetic field gradient in the first direction; and generating the image of step (g) from the totality of difference data sets obtained from all of the sequence pairs.

15. The method of claim 14, further comprising the steps of: processing the remaining response data of step (g) to obtain a first set of intensity $I_1$ data for each pixel in the chosen angiographic projection plane; repeating the total plurality of repetitions of the sequence of steps (b)–(g) with the first magnetic field gradient repositioned, in each repetition, along at least one other one of a second and third axis in a Cartesian coordinate system; processing the remaining response data of the step (g) of each repetition of the sequence of steps (b)–(g), to obtain a different designated set of intensity $I_2$ and $I_3$ data, respectively, for each pixel in the angiographic projection plane chosen for the repetition along the respective second and third axis; and processing, for each image pixel, the intensity data obtained for that image pixel for each of the different first gradient portions, to provide the RMS average intensity $I_{total}=(I_1^2+I_2^2+I_3^2)^{\frac{1}{2}}$, of the totality of difference data sets for image generation.

16. The method of claim 13, further comprising the step of adjusting the time duration $T_g$ of each gradient pulse to accept for imaging, without aliasing, the range of fluid flow velocities in the sample.

17. The method of claim 12, wherein step (b) comprises the step of applying a radio-frequency (RF) magnetic field to the sample with sufficient energy to nutate the net magnetization of the nuclear spins through an angle substantially equal to 90 degrees.

18. The method of claim 17, wherein the nutation of spins is to occur substantially only in the selected sample portion, and further comprising the step of applying the magnetic field gradient, in the first direction, to the sample during application of the RF magnetic field.

19. The method of claim 18, wherein the RF magnetic field is applied as a pulsed signal having a sin(x)/x envelope shape.

20. The method of claim 17, wherein step (d) further comprises the step of refocusing the spins of the nutated nuclei in between the application of the first and second flow-encoding gradient magnetic field pulses.

21. The method of claim 20, wherein the refocusing step includes the steps of: applying the magnetic field field to the sample with sufficient energy to nutate the net magnetization of the nuclear spins through an angle substantially equal to 180 degrees.

22. The method of claim 1, wherein the sample is a portion of human anatomy, and further comprising the step of gating the commencement of each sequence with respect to a designated point in the cardiac cycle of the human sample.

* * * * *